United States Patent

Buer et al.

[11] Patent Number: 5,952,886
[45] Date of Patent: Sep. 14, 1999

[54] MMIC POWER AMPLIFIER WITH DIAGONAL CIRCUITRY

[75] Inventors: Kenneth V. Buer; David W. Corman, both of Gilbert; James R. Clark, II, Phoenix, all of Ariz.

[73] Assignee: Motorola, Inc., Schaumburg, Ill.

[21] Appl. No.: 09/009,497

[22] Filed: Jan. 20, 1998

[51] Int. Cl.⁶ .................... H03F 3/68; H03F 3/14; H01L 29/76
[52] U.S. Cl. .................... 330/295; 330/307; 257/341
[58] Field of Search .................... 330/295, 277, 330/307, 286; 257/365, 341

[56] References Cited

U.S. PATENT DOCUMENTS 5,066,925  11/1991  Freitag ................................ 330/269
5,111,157  5/1992  Komiak ................................ 330/286
5,519,358  5/1996  Tserng ................................ 330/307
5,757,046  5/1998  Fujihira et al. ..................... 257/341

*Primary Examiner*—Robert Pascal
*Assistant Examiner*—Patricia T. Nguyen
*Attorney, Agent, or Firm*—Gregory J. Gorrie

[57] ABSTRACT

A multistage MMIC power amplifier with diagonal oriented field effect transistors (FETs) provides higher power output for a smaller MMIC die size. Corporate feed structures divide the RF input signal and combine the RF output signals and in a base two fashion. The corporate feed structures allow the FETs of the amplifier stages operate in-phase with adjacent circuitry appearing as an even-mode open circuit. The MMIC power amplifier is suitable for applications where reduced size, high efficiency and high gain are important, such as in commercial communication systems.

16 Claims, 2 Drawing Sheets

MMIC POWER AMPLIFIER WITH DIAGONAL CIRCUITRY

FIELD OF THE INVENTION

This invention relates in general to the field of power amplifiers, in particular to microwave power amplifiers and more particularly to Microwave Monolithic Integrated Circuits (MMICs) that use Field Effect Transistors (FETs) in power amplifiers.

BACKGROUND OF THE INVENTION

In power amplifiers, especially monolithic microwave integrated circuits (MMIC) power amplifiers, many amplifier devices, such as field effect transistors (FETs), may be combined in parallel to achieve high radio frequency (RF) power levels. RF signals are divided at the FET inputs and combined at the FET outputs. The output power of such MMIC FET power amplifiers is related to the number of FET devices in the amplifier—higher power amplifiers requiring more FETs. More FETs typically have required a larger MMIC die size due to the arrangement of the FETs on the die and requirements of the combiner and divider networks. However, larger MMIC die are more expensive as cost is approximately proportional to die size. Smaller MMIC die size is more desirable because of reduced cost, improved manufacturing and space requirements.

Amplifier technologies have been proposed to reduce space, such as that disclosed by Tserng (U.S. Pat. No. 5,519,358). However in Tserng, symmetric dividers and combiners can not be employed to allow even mode operation of the transistors, especially at high microwave frequencies.

Thus what is needed is a MMIC power amplifier that uses less die area. What is also needed is a power amplifier that may be manufactured for a lower cost. What is also needed is MMIC power amplifier that allows more FETs on the MMIC die. What is also needed is MMIC power amplifier that allows even mode operation of the FETs while reducing size and cost. What is also needed is a low cost, high gain, high efficiency microwave and millimeter wave frequency power amplifier suitable for use in commercial satellite, mobile communication and consumer products.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

The exemplification set out herein illustrates a preferred embodiment of the invention in one form thereof, and such exemplification is not intended to be construed as limiting in any manner.

DETAILED DESCRIPTION OF THE DRAWINGS

The present invention provides an MMIC microwave power amplifier with diagonal oriented field effect transistors (FETs), combining several FET devices in parallel to achieve high RF power levels. The present invention uses power dividing at the amplifier input and power combining at the amplifier output using corporate feed structures. The corporate feed structures combines or divides the RF power in a base two fashion. The corporate feed design has the advantage of symmetry in that each FET device can have substantially identical RF matching circuits. In the preferred embodiment of the present invention, all FETs of a particular stage operate in-phase with each other allowing even mode operation of the FETs. One advantage to even mode operation is that some impedance matching structures can be reduced in size by taking advantage of the even mode virtual oper circuit presented by adjacent FETs.

In the preferred embodiments of the present invention, wasted space present in corners of conventional power amp MMIC layouts is eliminated or minimized. Another advantage to the present invention is that the power per MMIC chip is not limited by the stack-up of FETs across the width of the chip. More FETs can be placed across the MMIC chip because in the preferred embodiment the FETs are staggered.

Another advantage to the present invention is that the output matching network is less lossy and provides a wider bandwidth than typical power amplifier layouts. Another advantage to the present invention is that the overall MMIC chip size is reduced helping to reduce the chip costs. Another advantage to the present invention is that the "postage stamp" line up of back vias are eliminated. The advantage to this is that the back vias are staggered across the die rather than in a straight line. This reduces the probability of cracking the die along a line of via perforations, and consequently increases the yield and reduces the die cost. In addition, by eliminating the via perforation line, the die are more robust and easier to handle and assemble. Another advantage to the present invention is a smaller die size which generally has a higher yield.

Figure 1:
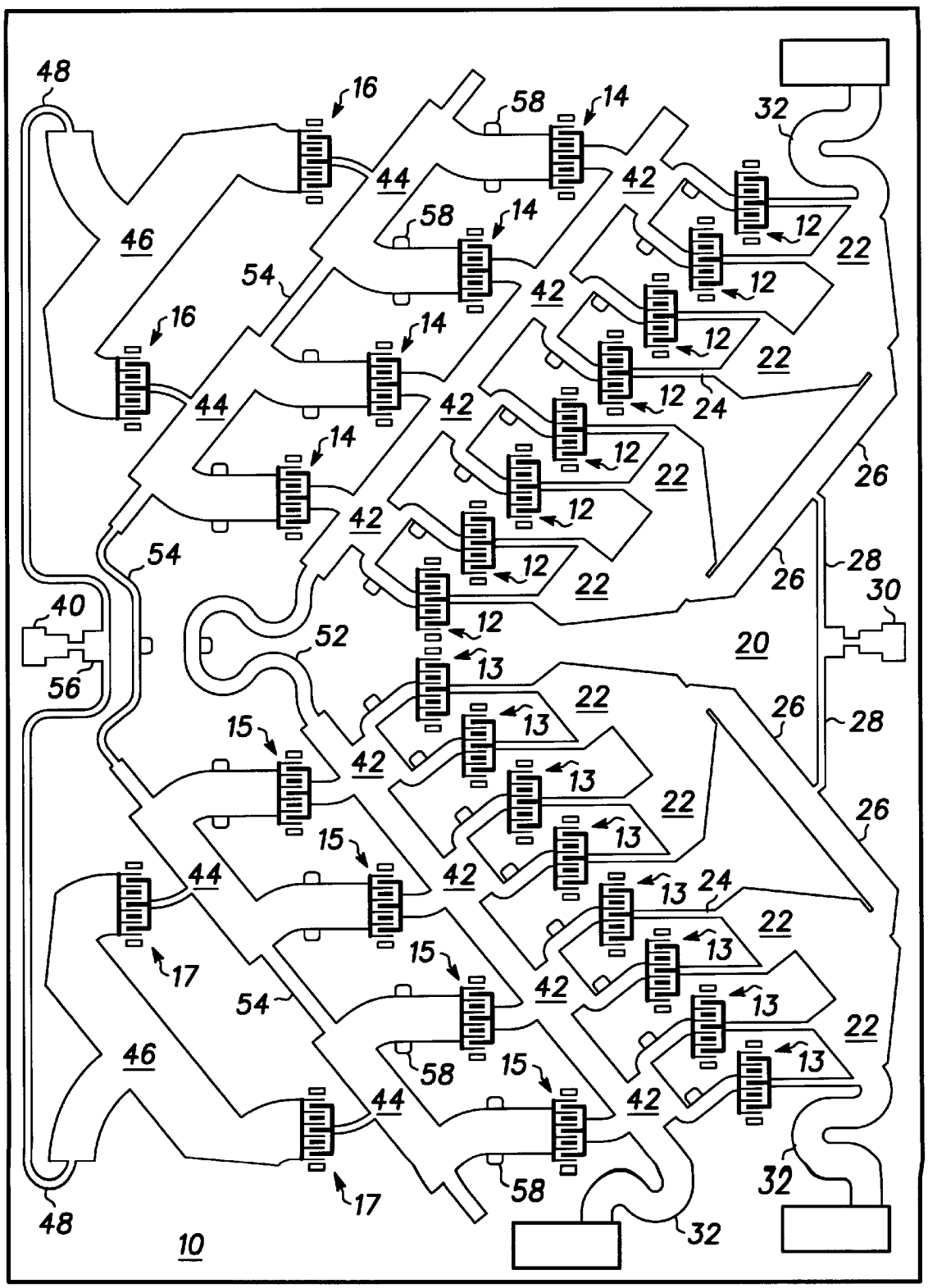
FIG. 1 illustrates a simplified MMIC layout of a power amplifier in accordance with a preferred embodiment of the present invention.

FIG. 1 illustrates a simplified MMIC layout of a power amplifier in accordance with a preferred embodiment of the present invention. MMIC power amplifier 20 is fabricated on MMIC substrate or MMIC chip 10 as shown in the embodiment of FIG. 1. In this embodiment, power amplifier 20 includes three stages of parallel signal amplification. FET pluralities 16 and 17 provide a first stage of amplification, FET pluralities 14 and 15 provide a second stage of amplification, and FET pluralities 12 and 13 provide a third stage of amplification. The present invention is applicable to more or less stages of amplification and more or less FETs per stage of amplification than as shown in FIG. 1. An RF signal at input 40 of power amplifier 20 is divided by a first power divider 56 and subsequently divided by corporate power dividers 46. The signal is then amplified by FET pluralities 16 and 17 in parallel and then divided by corporate power dividers 44. Once divided by power dividers 44, eight substantially in-phase RF signals are amplified by the second stage amplification FET pluralities 14 and 15. These FET pluralities provide the RF signal to corporate power dividers 42 which provide an amplified RF signal, substantially in phase to third stage amplification FET pluralities 12 and 13. The outputs of the third stage amplification FET pluralities are combined through an output matching and corporate combiner network comprised of combiners 22, 26, and 28 to provide one output signal at output port 30. In the preferred embodiment of the present invention, the matching structures and line lengths provide in-phase combining of the output signals.

Metalized areas 52 and 54 DC couple the various power dividers together to allow for the providing of DC current the FETs. Power dividers 42 are also coupled together with adjacent power dividers 42 to allow for the providing DC current the FETS. Other ways of providing DC bias current to the FETs may be equally suitable for the present invention.

Because the FETs and in particular the third stage amplification FET pluralities 12 and 13 are arranged in a diagonal, the third stage may include more FETs than may be typically spaced straight across the MMIC die. Because the FETs are staggered and placed along a diagonal, the length of the output circuitry is reduced, reducing the loss and accordingly providing a higher gain. Another advantage is that the output of the third stage FET pluralities 12 and 13 are transformed to a higher impedance more quickly providing a higher bandwidth than typical power amplifiers of this nature. Because all the FETs of a particular amplification stage operate in-phase such that all FETs of the amplification stage are operating in an even mode operation. Although not shown in FIG. 1, cluster matching is another technique that may be used. The cluster matching technique is a method of power combining or dividing while simultaneously impedance matching the FETs.

During the design process for the MMIC power amplifier of the present invention, a power transfer analysis is preferably performed. The output match for the power amplifier and the combiner are optimized for low-loss and high bandwidth, while at the same time the individual FET outputs are matched to their desirable low impedance.

The embodiment shown in FIG. 1, power amp 20 is suitable for any microwave and millimeter frequency range. When a frequency range around 30 GHz is chosen, the length of the MMIC chip shown in FIG. 1 is approximately 4.65 mm and the width is approximately 3.5 mm. In contrast, a conventional 30 GHz power amplifier MMIC with similar performance characteristics would require a die size of approximately 5.5 mm long and 5.5 mm wide. When a frequency range around 60 GHz is chosen, the power amplifier may use two stages of amplification and may use less FETs than that shown in FIG. 1. In the 60 GHz embodiment, the width and the length of the MMIC chip are reduced.

Figure 2:
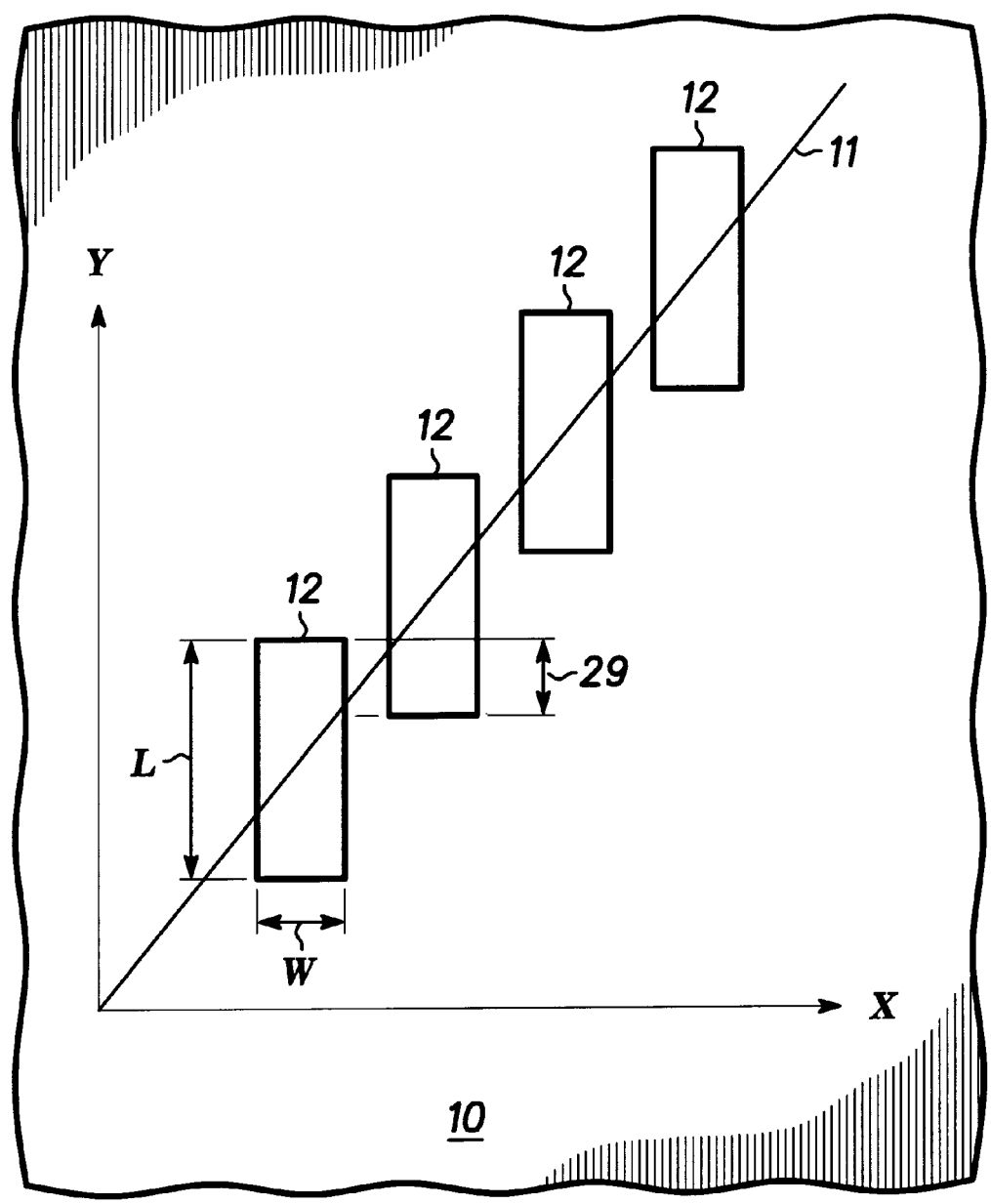
FIG. 2 is a graphical illustration of the diagonal placement of FETs on an MMIC die in accordance with a preferred embodiment of the present invention.

FIG. 2 is a graphical illustration of the diagonal placement of FETs on an MMIC die in accordance with a preferred embodiment of the present invention. MMIC chip 10, a portion of which is shown in FIG. 2, shows a plurality of FETs 12 arranged along diagonal 11. Each FET 12 is shown as overlapping in the Y-direction by an overlap amount 29. Each FET 12 is also shown as not overlapping in the X-direction. In certain embodiments of the present invention, this overlap is desirable. In other embodiments of the present invention, for example, where less FETs 12 are used, the overlap is not necessarily required. As can be seen from the illustration of FIG. 2, because of the staggered positioning of the FETs, more FETs can be placed in an electrical parallel configuration than if the FETs were lined up edge per edge across the chip. In the preferred embodiments of the present invention, the gate fingers of the FETs are in parallel, and although not shown in FIG. 2, the gate-fingers are desirably parallel to the X-dimension.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A microwave power amplifier comprising:

a first plurality of FETs arranged on an MMIC die in a first row, the first row being diagonal with respect to gate fingers of the FETs of the first plurality, said FETs of said first plurality being in an electrically parallel configuration;

a second plurality of FETs arranged on the MMIC die in a second row, the second row being diagonal with respect to gate fingers of the FETs of the second plurality, said FETs of said second plurality being in an electrically parallel configuration;

signal splitter circuitry for providing substantially in-phase signals to each FET of the first and second pluralities; and combiner circuitry for in-phase combining outputs of each of said FETs to provide an output signal.

2. A microwave power amplifier comprising:

a first plurality of FETs arranged on an MMIC die in a first diagonal row, said FETs of said first plurality being in an electrically parallel configuration;

a second plurality of FETs arranged on the MMIC die in a second diagonal row, said FETs of said second plurality being in an electrically parallel configuration;

signal splitter circuitry for providing substantially in-phase signals to each FET of the first and second pluralities; and combiner circuitry for in-phase combining outputs of each of said FETs to provide an output signal, wherein said FETs of the first plurality overlap with adjacent FETs of the first plurality in a Y-dimension of the MMIC die, and said FETs of the first plurality do not overlap with adjacent FETs of the first plurality in a X-dimension of the MMIC die.

3. The power amplifier as claimed in claim 2 wherein each FET of the first and second pluralities having gate fingers in parallel with gate fingers of the other FETs of the plurality.

4. A microwave power amplifier comprising:

a first plurality of FETs arranged on an MMIC die in a first diagonal row, said FETs of said first plurality being in an electrically parallel configuration;

a second plurality of FETs arranged on the MMIC die in a second diagonal row, said FETs of said second plurality being in an electrically parallel configuration;

signal splitter circuitry for providing substantially in-phase signals to each FET of the first and second pluralities;

combiner circuitry for in-phase combining outputs of each of said FETs to provide an output signal, a third plurality of FETs arranged on the MMIC die in a third diagonal row, said FETs of said third plurality being in an electrically parallel configuration;

a fourth plurality of FETs arranged on the MMIC die in a fourth diagonal row, said FETs of said fourth plurality being in an electrically parallel configuration;

wherein the third plurality of FETs provides first in-phase signals to said first plurality and the fourth plurality of FETs provides second in-phase signals to the second plurality; said first and second in-phase signals being in-phase with each other.

5. The power amplifier as claimed in claim 4 wherein each FET of the third and fourth pluralities having their gate fingers in parallel with gate fingers of the other FETs of the third and fourth pluralities.

6. The power amplifier as claimed in claim 4 wherein the first and third diagonal rows are arranged on the MMIC die substantially in parallel with each other, and wherein the second and fourth diagonal rows are arranged on the MMIC die substantially in parallel with each other.

7. The power amplifier as claimed in claim 4 further comprising:

a fifth plurality of FETs arranged on the MMIC die in a fifth diagonal row, said FETs of said fifth plurality being in an electrically parallel configuration;

a sixth plurality of FETs arranged on the MMIC die in a sixth diagonal row, said FETs of said sixth plurality being in an electrically parallel configuration;

wherein the fifth plurality of FETs provides third in-phase signals to said third plurality and the sixth plurality of FETs provides fourth in-phase signals to the fourth plurality; said third and fourth in-phase signals being substantially in-phase with each other.

8. The power amplifier as claimed in claim 7 wherein each FET of the fifth and sixth pluralities having their gate fingers in parallel with gate fingers of the other FETs of the fifth and sixth pluralities.

9. A microwave power amplifier comprising:

a first plurality of FETs arranged on an MMIC die in a first diagonal row, said FETs of said first plurality being in an electrically parallel configuration;

a second plurality of FETs arranged on the MMIC die in a second diagonal row, said FETs of said second plurality being in an electrically parallel configuration;

signal splitter circuitry for providing substantially in-phase signals to each FET of the first and second pluralities; and combiner circuitry for in-phase combining outputs of each of said FETs to provide an output signal, wherein each FET of the first plurality has an width and a length dimension associated therewith, the width and length dimensions being planar with the MMIC die, wherein FETs of the first plurality are staggered along the first diagonal row, the first diagonal row having an X-dimension and a Y-dimension, the length dimension of said FETs of the first plurality being in the Y-dimension, the widths of the FETs of the first plurality being in the X-dimension.

10. The power amplifier as claimed in claim 9 wherein the sum of lengths of all FETs of the first plurality is greater than a total length of said first diagonal row in the Y-dimension; and wherein the sum of widths of all FETs of the first plurality is less than a total width of said first diagonal row in the X-dimension.

11. The power amplifier as claimed in claim 10 wherein said FETs of the first plurality overlap with adjacent FETs of the first plurality in the Y-dimension, and said FETs of the first plurality do not overlap with adjacent FETs of the first plurality in the X-dimension.

12. The power amplifier as claimed in claim 11 wherein the first and second pluralities of FETs, the signal splitter circuitry, and the combiner circuitry are fabricated on a single MMIC die.

13. A MMIC power amplifier comprising:

an MMIC substrate; and a plurality of FETs arranged on the MMIC substrate in first and second diagonal rows, said FETs being in an electrically parallel configuration, wherein each FET of the plurality has an width and a length dimension associated therewith, the width and length dimensions being planar with the MMIC substrate, the FETs being staggered along the first and second diagonal rows, the diagonal rows having an X-dimension and a Y-dimension associated therewith, the length dimension of said FETs being in the Y-dimension, the width dimension of the FETs being in the X-dimension, wherein said FETs along the first diagonal overlap with adjacent FETs in the Y-dimension, and said FETs along the second diagonal overlap with adjacent FETs in the Y-dimension.

14. The MMIC power amplifier as claimed in claim 13 further comprising:

signal splitter circuitry for providing substantially in-phase signals to each FET of the plurality; and combiner circuitry for in-phase combining outputs of each of said FETs to provide an output signal.

15. A microwave power amplifier comprising:

a first plurality of FETs arranged on an MMIC die in a first diagonal row, said FETs of said first plurality being in an electrically parallel configuration;

a second plurality of FETs arranged on the MMIC die in a second diagonal row, said FETs of said second plurality being in an electrically parallel configuration, wherein said FETs of the first plurality overlap with adjacent FETs of the first plurality in a Y-dimension of the MMIC die, and said FETs of the first plurality do not overlap with adjacent FETs of the first plurality in a X-dimension of the MMIC die, and wherein each FET of the first and second pluralities having gate fingers in parallel with gate fingers of the other FETs of the plurality;

a third plurality of FETs arranged on the MMIC die in a third diagonal row, said FETs of said third plurality being in an electrically parallel configuration;

a fourth plurality of FETs arranged on the MMIC die in a fourth diagonal row, said FETs of said fourth plurality being in an electrically parallel configuration, wherein the third plurality of FETs provides first in-phase signals to said first plurality and the fourth plurality of FETs provides second in-phase signals to the second plurality; said first and second in-phase signals being in-phase with each other, wherein each FET of the third and fourth pluralities having their gate fingers in parallel with gate fingers of the other FETs of the third and fourth pluralities;

a fifth plurality of FETs arranged on the MMIC die in a fifth diagonal row, said FETs of said fifth plurality being in an electrically parallel configuration;

a sixth plurality of FETs arranged on the MMIC die in a sixth diagonal row, said FETs of said sixth plurality being in an electrically parallel configuration, wherein the fifth plurality of FETs provides third in-phase signals to said third plurality and the sixth plurality of FETs provides fourth in-phase signals to the fourth plurality; said third and fourth in-phase signals being substantially in-phase with each other;

signal splitter circuitry for providing substantially in-phase signals to each FET of the fifth and sixth pluralities; and combiner circuitry for in-phase combining outputs of each of said FETs of the first and second pluralities to provide an output signal.

16. A microwave power anplifier comprising:

a plurality of FETs arranged on an MTIC die in a first diagonal row, said FETs of said first plurality being in an electrically parallel configuration;

signal splitter circuitry for providing substantially in-phase signals to each FET of the first purality; and combiner circuitry for in-phase combining outputs of each of said FETs to provide an output signal, wherein each FETs overlap with an adjacent FET of the plurality in a Y-dimension of the MMIC die, and each FET does not overlap with adjacent FETs of the plurality in a X-dimension of the MMIC die.

* * * * *